(12) United States Patent
Fabregat Balboa et al.

(10) Patent No.: US 9,641,050 B2
(45) Date of Patent: May 2, 2017

(54) WIND TURBINE GENERATOR

(75) Inventors: Guillermo Fabregat Balboa, Barcelona (ES); Daniel García I Erill, Barcelona (ES); Santiago Claramunt Estecha, Barcelona (ES)

(73) Assignee: ALSTOM Renovables España, S.L., Barcelona (ES)

( * ) Notice: Subject to any disclaimer, the term of this patent is extended or adjusted under 35 U.S.C. 154(b) by 554 days.

(21) Appl. No.: 14/232,244

(22) PCT Filed: Jul. 17, 2012

(86) PCT No.: PCT/EP2012/063946
§ 371 (c)(1),
(2), (4) Date: Jan. 10, 2014

(87) PCT Pub. No.: WO2013/011004
PCT Pub. Date: Jan. 24, 2013

(65) Prior Publication Data
US 2014/0132005 A1    May 15, 2014

Related U.S. Application Data

(60) Provisional application No. 61/536,291, filed on Sep. 19, 2011.

(30) Foreign Application Priority Data

Jul. 18, 2011 (EP) ..................... 11382246

(51) Int. Cl.
*H02K 7/18* (2006.01)
*F03D 7/02* (2006.01)
(Continued)

(52) U.S. Cl.
CPC ........... *H02K 7/183* (2013.01); *F03D 7/0272* (2013.01); *F03D 9/002* (2013.01); *F03D 17/00* (2016.05);
(Continued)

(58) Field of Classification Search
CPC .................. F03D 7/00; G01B 11/14
(Continued)

(56) References Cited

U.S. PATENT DOCUMENTS 6,198,196 B1 *  3/2001  De Simon .............. H02K 21/02
                                                    105/53
6,781,276 B1 *  8/2004  Stiesdal ................. F03D 1/001
                                                    290/44
(Continued)

FOREIGN PATENT DOCUMENTS

EP    2 063 114    5/2009
EP    2 106 013    9/2009
(Continued)

OTHER PUBLICATIONS

Notice of Opposition for EP 2 549100 B1 from EPO dated Mar. 30, 2015, 12 pgs.
(Continued)

*Primary Examiner* — Burton Mullins
(74) *Attorney, Agent, or Firm* — Dority & Manning, P.A.

(57) ABSTRACT

A wind turbine generator comprising a rotor, a stator and an air gap between a gap-delimiting region of the stator and a gap-delimiting region of the rotor; wherein the rotor and/or the stator are deformable under operational loads and configured in such a way that the air gap resulting from the presence of operational loads is more uniform than the air gap in the absence of operational loads. A method for optimizing an air gap between a gap-delimiting region of a stator and a gap-delimiting region of a rotor of a wind turbine generator, said rotor and/or said stator being deformable under operational loads and said optimization consisting in that the air gap resulting from the presence of the set of operational loads is more uniform than the air gap in the absence of the set of operational loads.

13 Claims, 10 Drawing Sheets

(51) Int. Cl.
*F03D 9/00* (2016.01)
*H02K 1/06* (2006.01)
*H02K 15/16* (2006.01)
*G06F 17/50* (2006.01)
*F03D 17/00* (2016.01)

(52) U.S. Cl.
CPC ........... *G06F 17/5009* (2013.01); *H02K 1/06* (2013.01); *H02K 7/1838* (2013.01); *H02K 15/16* (2013.01); *F05B 2220/7066* (2013.01); *F05B 2270/305* (2013.01); *H02K 2201/03* (2013.01); *Y02E 10/723* (2013.01); *Y02E 10/725* (2013.01)

(58) Field of Classification Search
USPC ........................................ 310/90, 51; 290/55
See application file for complete search history.

(56) References Cited

U.S. PATENT DOCUMENTS

| | | | |
|---|---|---|---|
| 6,903,485 | B2 | 6/2005 | Chen et al. |
| 7,656,135 | B2* | 2/2010 | Schram ..................... F03D 7/02 322/59 |
| 8,536,753 | B2* | 9/2013 | Stiesdal ............... H02K 1/2786 310/193 |
| 8,558,426 | B2* | 10/2013 | Stiesdal ............... H02K 1/2786 310/156.26 |
| 2006/0152014 | A1 | 7/2006 | Grant et al. |
| 2007/0292260 | A1* | 12/2007 | Bagepalli ............. F03D 7/0224 415/14 |
| 2008/0265702 | A1* | 10/2008 | Yeh ...................... H02K 21/026 310/90 |
| 2009/0015020 | A1* | 1/2009 | Stiesdal ................. F03D 9/002 290/55 |
| 2011/0233938 | A1* | 9/2011 | Stiesdal ................. H02K 1/182 290/55 |

FOREIGN PATENT DOCUMENTS

| | | | |
|---|---|---|---|
| EP | 2 108 832 | | 10/2009 |
| EP | 2 237 398 | | 10/2010 |
| EP | 2 333 933 | | 8/2011 |
| EP | 2 333 934 | | 8/2011 |
| EP | 2549100 | B1 | 1/2013 |
| WO | WO 2010/072645 | | 7/2010 |
| WO | 2011058215 | * | 5/2011 ............... H02K 1/27 |

OTHER PUBLICATIONS

Hauptmann et al., "Advanced Drive Train Modeling in a Virtual Wind Turbine Using the Multibody Simulation Code Simpack", published in EWEC, 6 pgs. (2007).

Nilsson et al., "Simulation of Direct Drive Generators Designed for Underwater Vertical Axis Turbines", Uppsala University, Presented at Fifth EU Wave Energy Conference, Ireland Sep. 17-20, 2003.

Shuting Wan et al., "Investigation on Stator and Rotor Vibration Characteristics of Turbo-Generator Under Air Gap Eccentricity Fault", Transaction of Canadian Soc. for Mech. Engineering vol. 35, No. 2, pp. 161-176, Mar. 2011.

International Search Report for PCT/EP2012063946, mailed Oct. 29, 2012, 10 pgs.

* cited by examiner

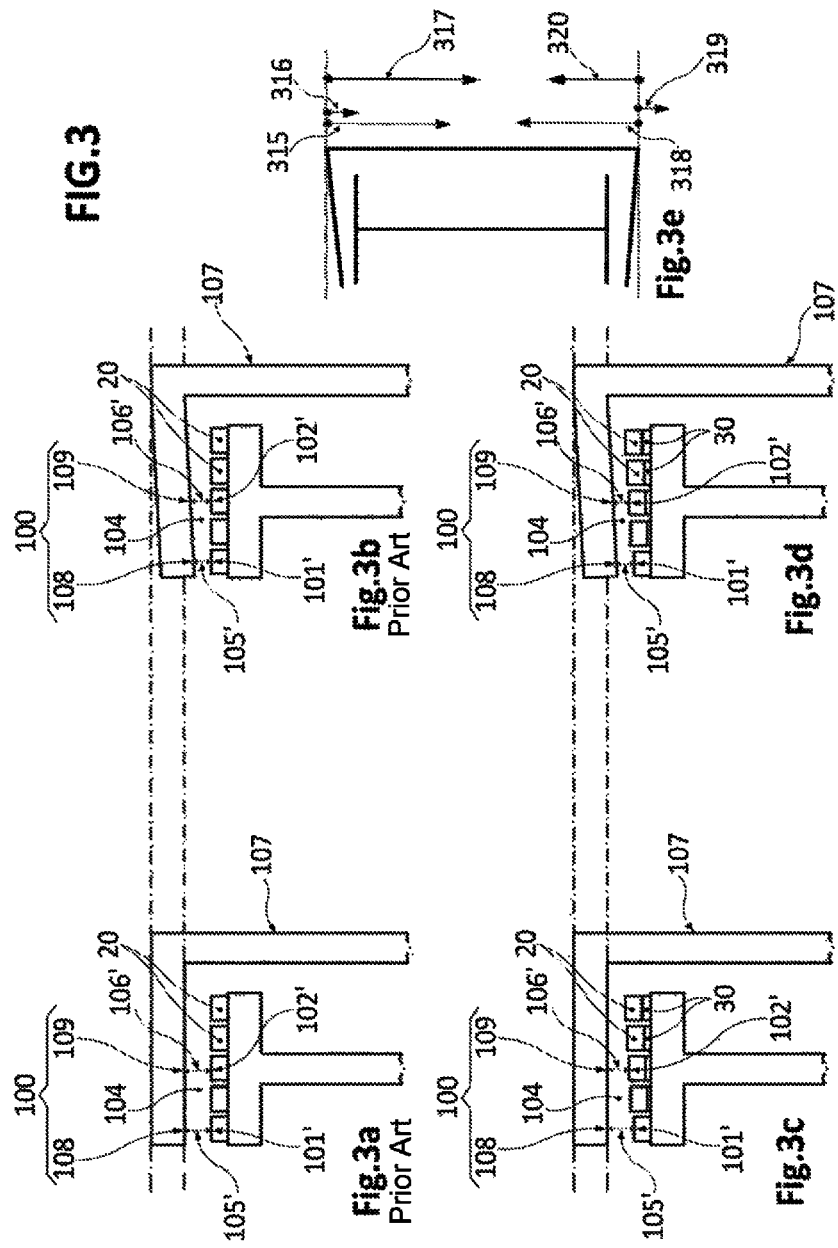

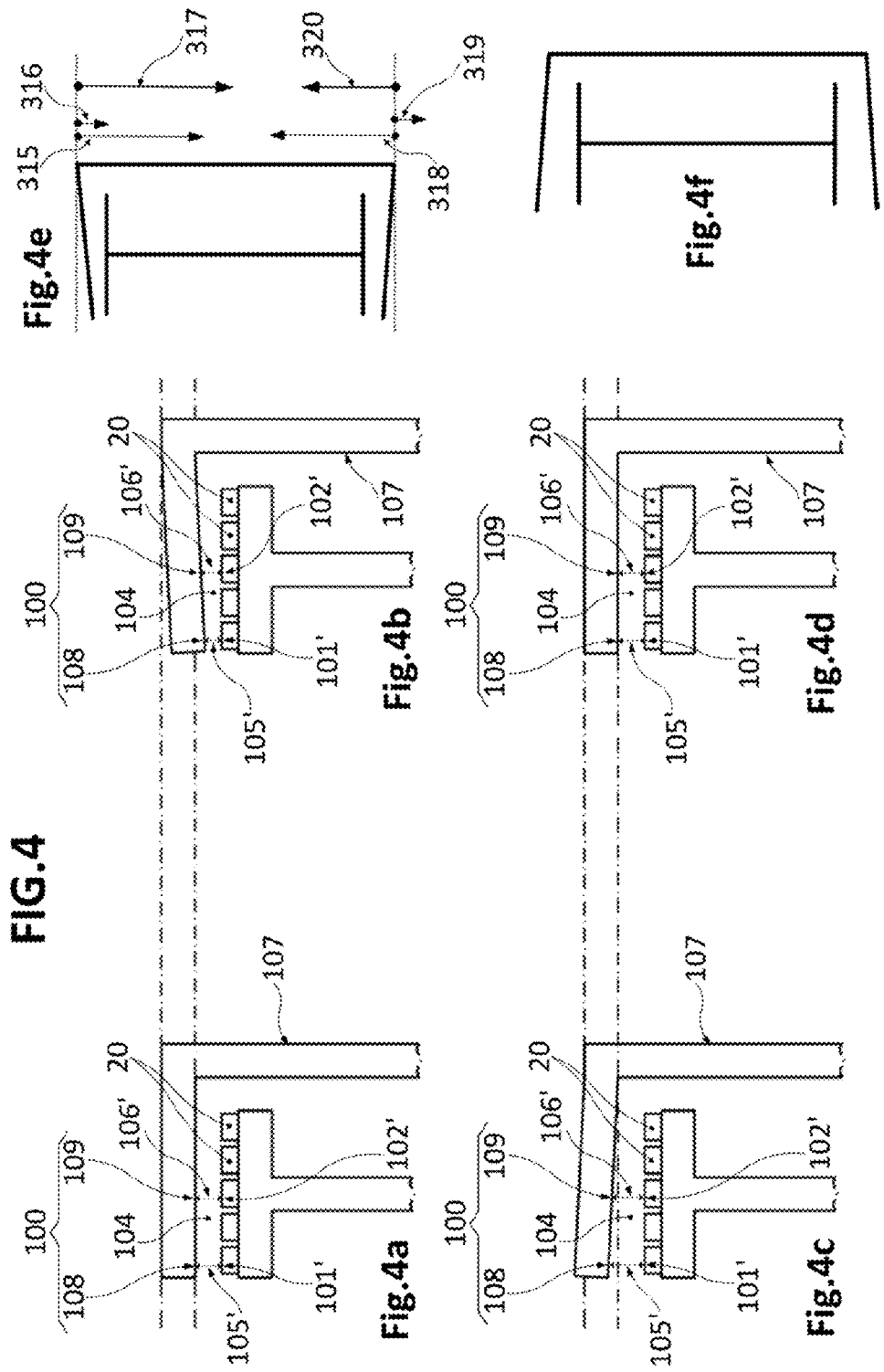

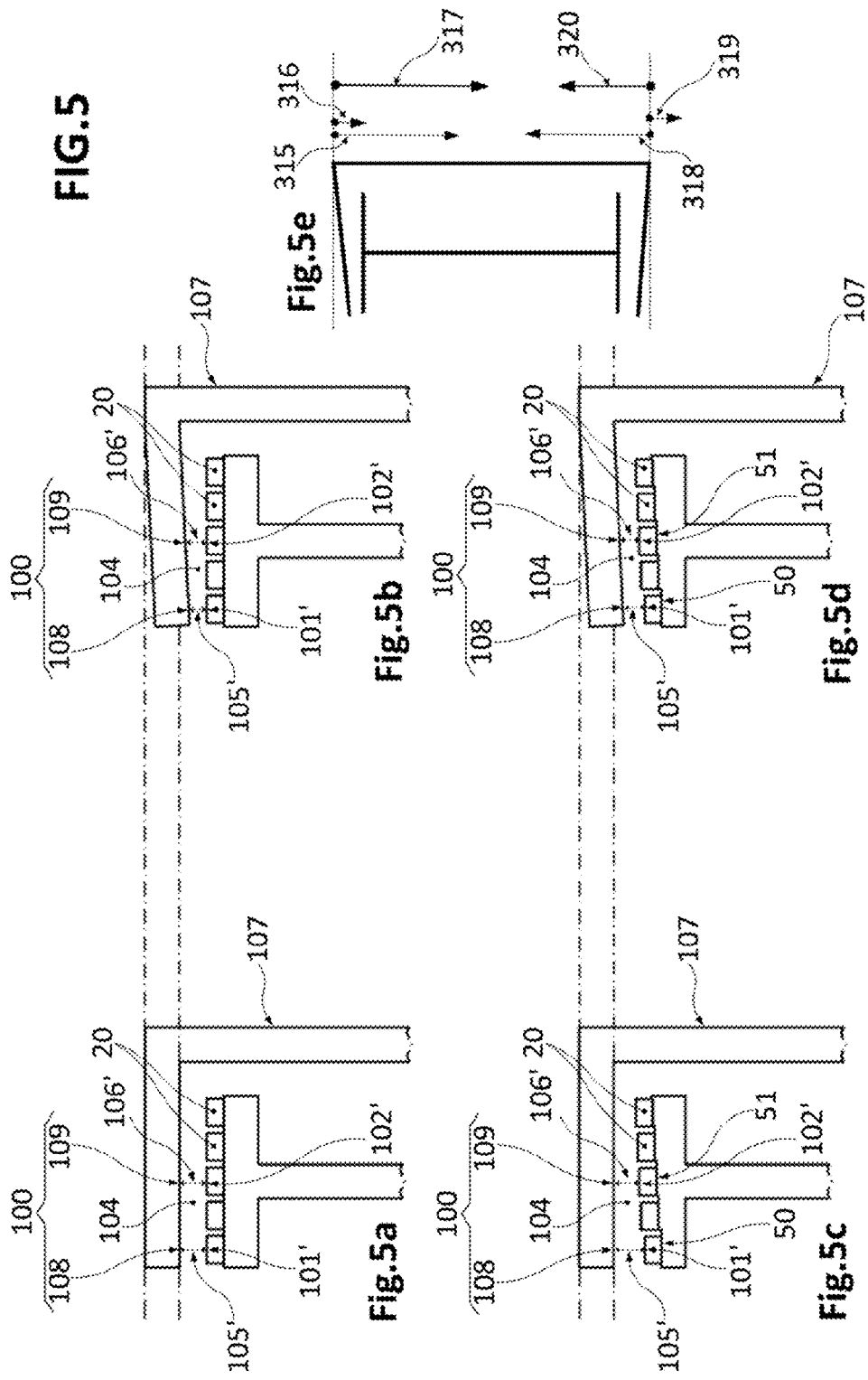

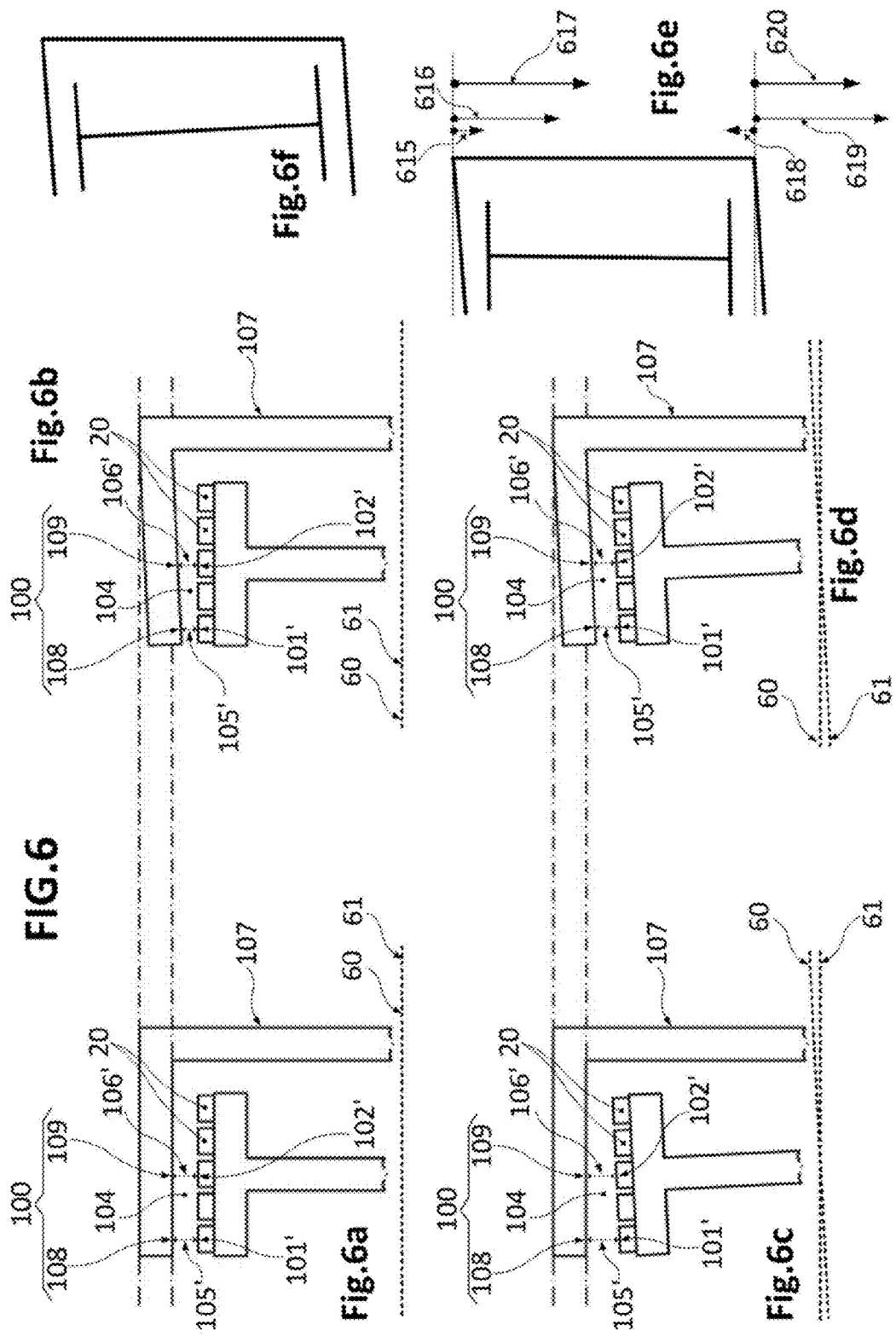

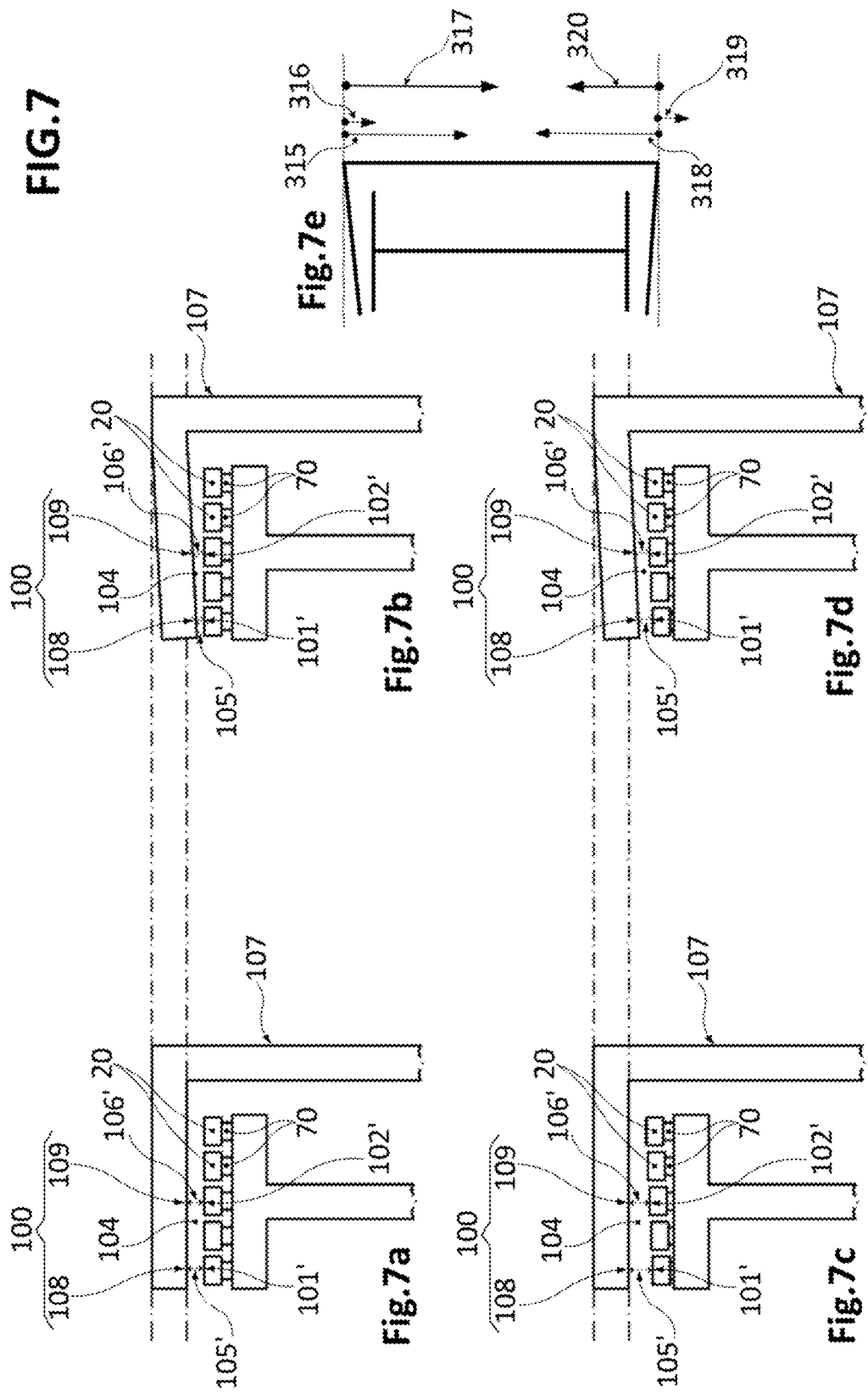

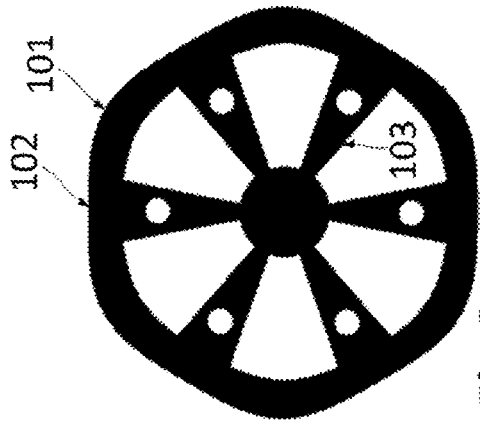
Fig.8c
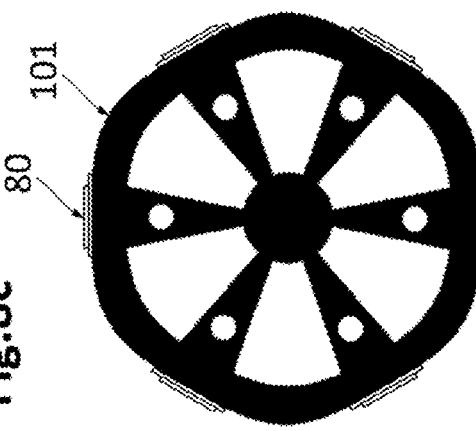
Fig.8f
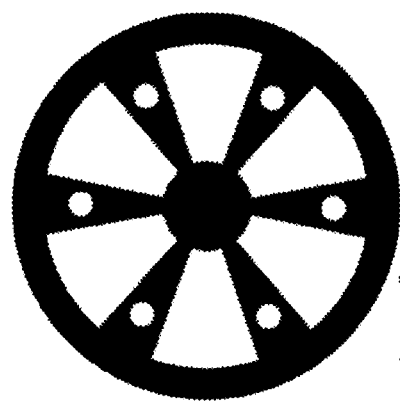
FIG.8
Fig.8b
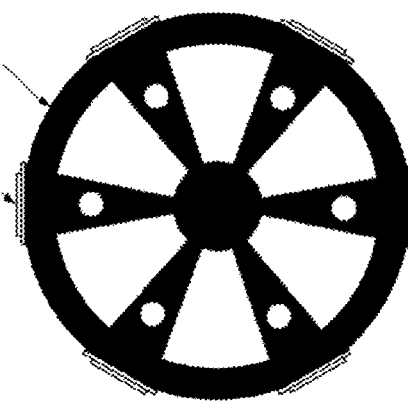
Fig.8e
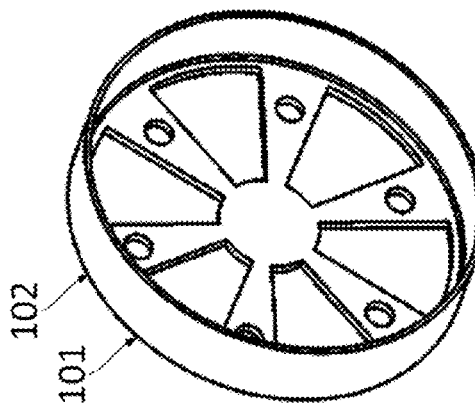
Fig.8a
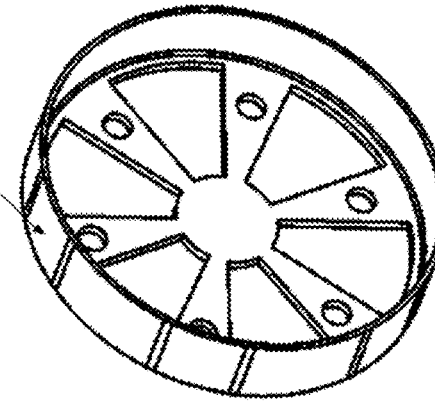
Fig.8d

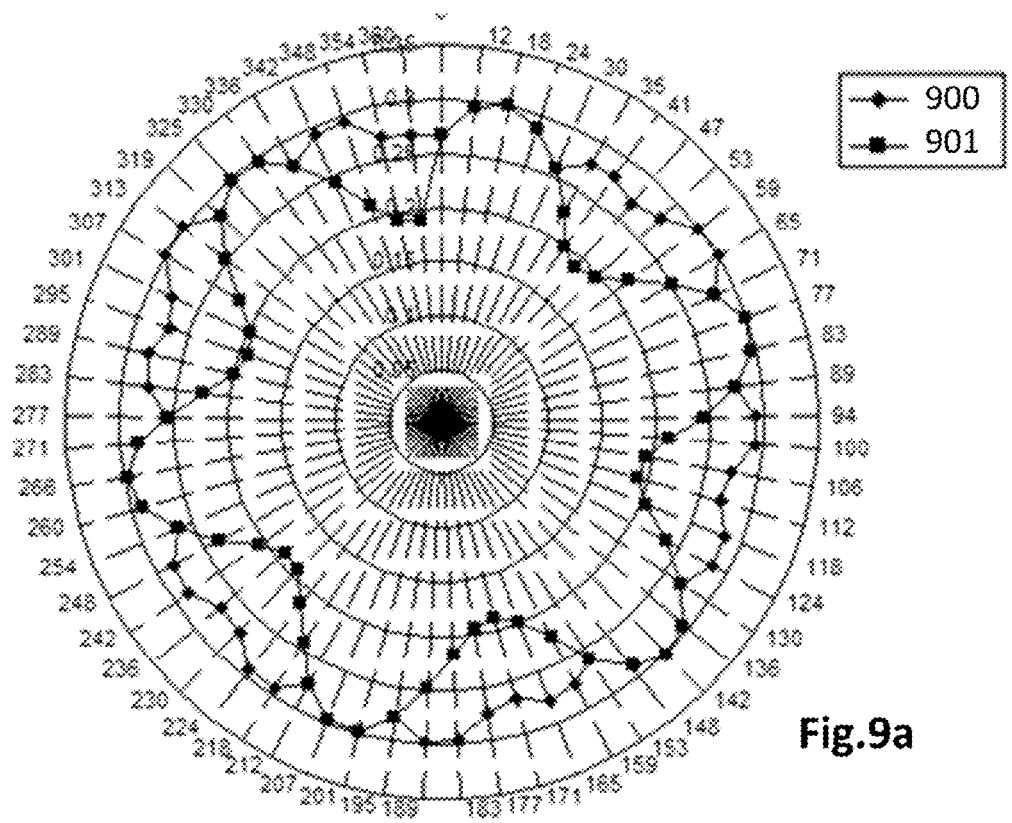
Fig.9a
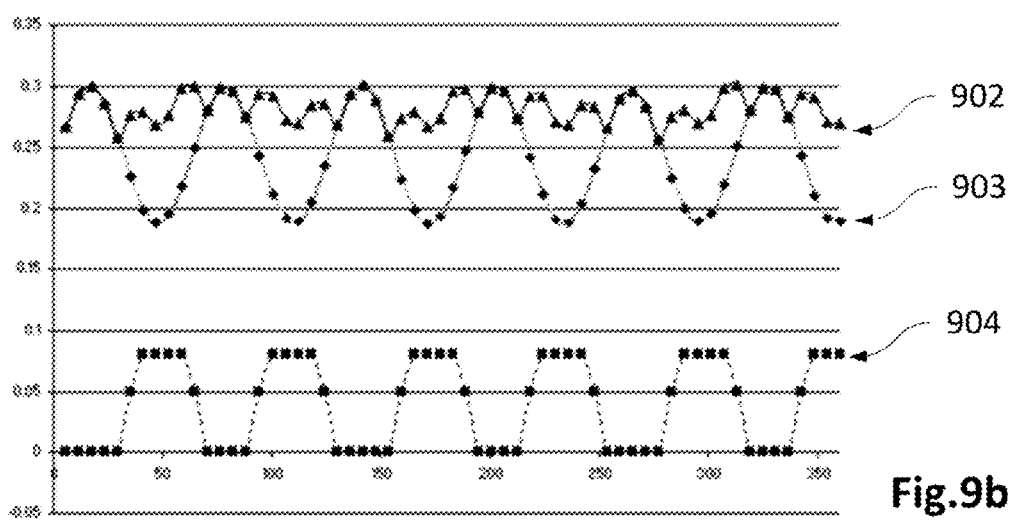
Fig.9b
FIG.9

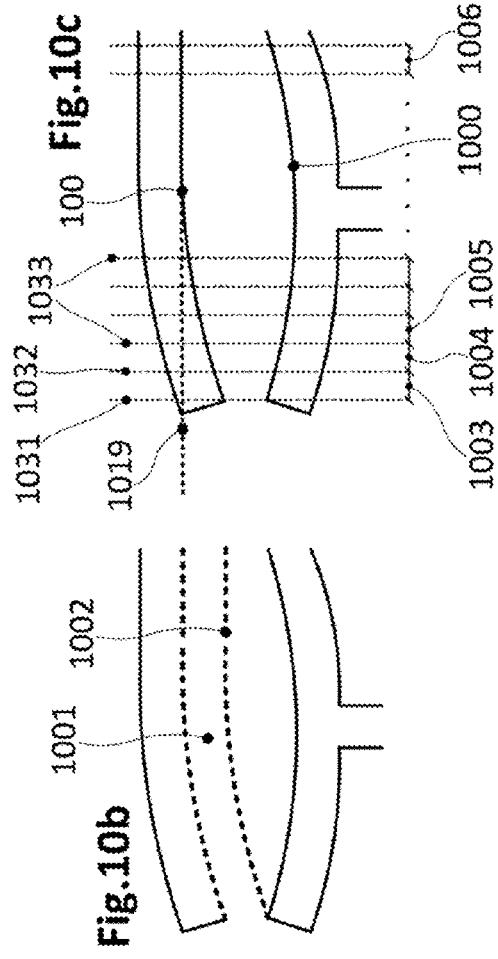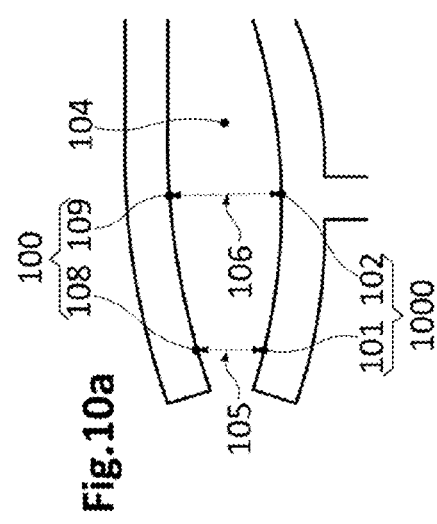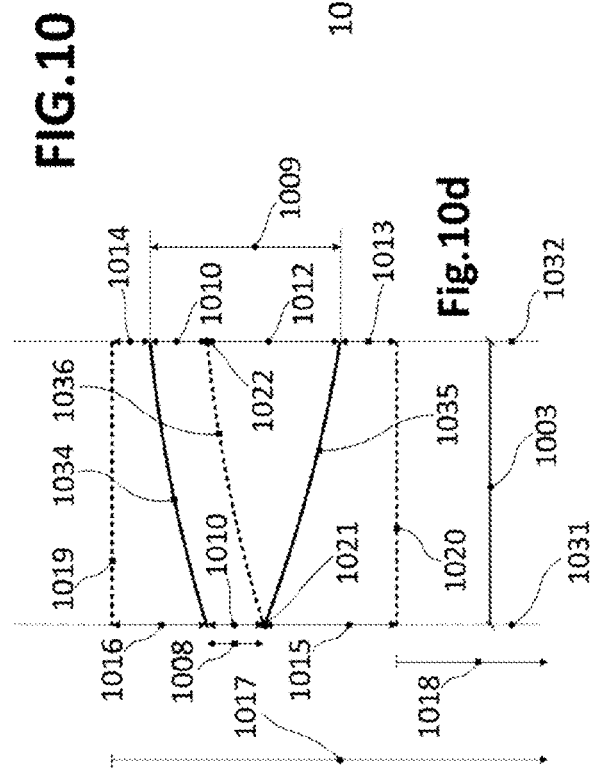
FIG. 10

WIND TURBINE GENERATOR

This application claims the benefit of European Patent Application EP11382246 filed 18 Jul. 2011 and U.S. Provisional Patent Application Ser. No. 61/536,291 filed 19 Sep. 2011.

The present invention relates to a wind turbine generator comprising a rotor, a stator and an air gap between a gap-delimiting region of the stator and a gap-delimiting region of the rotor, said rotor and/or stator being deformable under operational loads.

The present invention also relates to a method for optimizing an air gap between a gap-delimiting region of a stator and a gap-delimiting region of a rotor of a wind turbine generator, said rotor and/or said stator being deformable under operational loads.

BACKGROUND ART

Wind turbine generators (e.g. self-excited or with permanent magnets) may be exposed to deformations of their rotor and/or stator due to the effect of operational loads (e.g. weight of the rotor/stator, electromagnetic forces between the rotor and stator, etc.). These deformations may cause degradation of the air gap between the rotor and the stator, said degradation producing bad performance and reduction of the life of the generator.

It is known, for example, that deformations of the rotor/stator and the consequent degradation of the air gap causes unbalanced attracting loads that generate a pull force. This pull force, which increases as air gap degradation increases, may affect the generator's performance, the life of the generator's components such as rotor, stator, generator bearing, elastic coupling and others components of the wind turbine (e.g. frames).

Nowadays, some designs put into practice generators with heavy parts for increasing the stiffness of the generator's components and, thus, to reduce the deformation of the rotor/stator with the objective of ensuring a constant air gap between the stator and the rotor. However, the application of this approach generates very heavy structures whose e.g. manufacture and transport are very costly.

EP2106013A2 shows another approach by disclosing a deflection resistant wind turbine generator in which the stator and the rotor have selectively engageable surfaces that maintain the air gap as substantially stable and permit rotation of the rotor during engagement, said engageable surfaces engaging when the rotor deflects to a predetermined amount of deflection. Moreover, EP2106013A2 also describes that said selectively engageable surfaces may include a set of internal bearings.

EP2063114A1 shows yet another approach by disclosing a wind turbine that comprises a retaining arrangement (e.g. a main frame in form of a retaining arm) which supports a supporting element of the rotor and is connected to a supporting element of the stator, so that stability of the rotor-stator structure is increased.

Nevertheless, the approaches commented in the two previous paragraphs usually involve complex geometries, introduce additional components, etc. The resulting wind turbine generators may thus be expensive and difficult to maintain.

SUMMARY OF THE INVENTION

There thus still exists a need for new wind turbine generators and air gap optimization methods solving at least some of the above mentioned drawbacks. It is an object of the present invention to fulfil such a need.

The object is achieved by a wind turbine generator, comprising: a rotor, a stator and an air gap between a gap-delimiting region of the stator and a gap-delimiting region of the rotor in the absence of operational loads; wherein the rotor and/or the stator are deformable under the operational loads and configured in such a way that an air gap between the gap-delimiting region of the stator and the gap-delimiting region of the rotor resulting from the presence of the operational loads is more uniform than the air gap in the absence of the operational loads.

The object is also achieved by a method for optimizing an air gap between a gap-delimiting region of a stator and a gap-delimiting region of a rotor of a wind turbine generator, the rotor and/or the stator being deformable under a set of operational loads and the optimization consisting of the air gap resulting from the presence of the set of operational loads is more uniform than the air gap in the absence of the set of operational loads; the method comprising:

repeating until an ending condition is satisfied:
  simulating operation of the rotor and the stator under the set of operational loads, the simulation being based on a test rotor representing the rotor, a test stator representing the stator and a test air gap between the test rotor and test stator;
  verifying if the test air gap satisfies an air gap model;
    in the case of a positive result:
      causing satisfaction of the ending condition;
    in the case of a negative result:
      calculating a test correction of the test rotor and/or the test stator for adapting the test air gap to satisfy the air gap model;
      applying the test correction to the test rotor and/or test stator for its consideration in the next simulation;
verifying if one or more test corrections have been produced; and
  in the case of a positive result:
    applying the test corrections to the rotor and/or the stator.

In a first aspect, the present invention provides a wind turbine generator comprising a rotor, a stator and an air gap between a gap-delimiting region of the stator and a gap-delimiting region of the rotor; wherein the rotor and/or the stator are deformable under operational loads and configured in such a way that the air gap resulting from the presence of operational loads is more uniform than the air gap in the absence of operational loads.

The structure of the generator of this first aspect is based on taking advantage of the deformations suffered by the rotor/stator under operational loads by pre-shaping the rotor/stator in such a way that said deformations cause a more uniform air gap. Two different situations are considered: a default situation, which refers to the absence of operational loads, and a load situation, which refers to the presence of operational loads. The key point of this first aspect of the invention is that the rotor/stator in the default situation has a configuration (e.g. introducing apparent distortions) such that the rotor/stator in the load situation constitutes an air gap more uniform than the air gap in the default situation.

This innovative first aspect may be seen as a paradox, since an apparently misshapen design of the rotor/stator in the default situation results in a better shape of the rotor/stator in the load situation. Thus, the generator of this first aspect has advantages such as extending the life of the generator, improving its performance, etc. without e.g. increasing the mass/weight of the generator.

In a second aspect, the present invention provides a method for optimizing an air gap between a gap-delimiting region of a stator and a gap-delimiting region of a rotor of a wind turbine generator, said rotor and/or said stator being deformable under a set of operational loads and said optimization consisting in that the air gap resulting from the presence of the set of operational loads is more uniform than the air gap in the absence of the set of operational loads.

The method of this second aspect comprises simulating operation of the rotor and the stator under the set of operational loads, said simulation being based on a test rotor representing the rotor, a test stator representing the stator and a test air gap between said test rotor and test stator. Once the simulation is completed, it is verified if the test air gap satisfies an air gap model. In case the test air gap does not satisfy the air gap model, a test correction of the test rotor and/or the test stator for adapting the test air gap to satisfy the air gap model is calculated, and said test correction is applied to the test rotor and/or test stator for its consideration in a next simulation.

The treatment described in the previous paragraph is repeated until the test air gap satisfies the air gap model. Then, in case of said treatment having produced one or more test corrections, said test corrections are applied to the rotor and/or the stator of the wind turbine generator.

This method allows producing a generator in which the air gap constituted by the rotor/stator in the load situation is more uniform than the air gap in the default situation. Thus, the principles and advantages commented with respect to the first aspect may also be applied to this second aspect.

Additional objects, advantages and features of embodiments of the invention will become apparent to those skilled in the art upon examination of the description, or may be learned by practice of the invention.

BRIEF DESCRIPTION OF THE DRAWINGS

Particular embodiments of the present invention will be described in the following by way of non-limiting examples, with reference to the appended drawings, in which:

FIG. 1a is a frontal view of the motor-stator configuration of FIG. 1:

FIG. 1b is a cross sectional view of the motor-stator configuration according to the plane indicated in FIG. 1a through A and A';

FIG. 1c is a frontal view of the motor-stator configuration of FIG. 1 showing deformations of the rotor/stator shown in the load situation:

FIG. 1d is a cross sectional view of the motor-stator configuration according to the plane indicated in FIG. 1a through A and A' showing deformations of the rotor/stator due to operational loads;

FIG. 1e is a cross sectional view of the motor-stator configuration of FIG. 1 showing an example of forces that could cause the deformations reflected in FIGS. 1c and 1d;

FIG. 2a is a frontal view of a rotor/stator according to FIG. 2 showing a gap-delimiting region formed by uniformly distributed magnets of the same size;

FIG. 2b is a frontal view of a rotor/stator according to FIG. 2 showing a gap-delimiting region formed by uniformly distributed magnets with one bigger magnet forming a local protrusion;

FIG. 2c is a frontal view of a rotor/stator according to FIG. 2 showing a gap-delimiting region formed by uniformly distributed magnets with one smaller magnet forming a local depression;

FIG. 3 is a schematic representation of a prior art rotor-stator configuration and a rotor-stator configuration according to a first embodiment of the invention;

FIG. 3a is a cross sectional view of the prior art rotor-stator configuration according to FIG. 3 with a gap-delimiting region constituted by magnets;

FIG. 3b shows the configuration of FIG. 3a deformed by operational loads;

FIG. 3c is a cross sectional view of the rotor-stator configuration of the first embodiment of the invention according to FIG. 3;

FIG. 3d shows the configuration of FIG. 3c deformed by operational loads;

FIG. 3e shows forces acting on FIG. 3 causing the deformations shown in FIGS. 3b and 3d;

FIG. 4 is a schematic representation of the prior art rotor-stator configuration shown in FIG. 3 and a rotor-stator configuration according to a second embodiment of the invention;

FIG. 4a is a cross sectional view of the prior art rotor-stator configuration according to FIG. 4 with a sap-delimiting region constituted by magnets;

FIG. 4b shows the configuration of FIG. 4a deformed by operational loads;

FIG. 4c is a cross sectional view of the pre-deformed rotor-stator configuration of the second embodiment of the invention according to FIG. 4;

FIG. 4d shows the configuration of FIG. 4c deformed by operational loads;

FIG. 4e shows forces acting on FIG. 4 causing the deformations shown in FIG. 4b;

FIG. 4f shows forces acting on FIG. 4 causing the deformations shown in FIG. 4d;

FIG. 5 is a schematic representation of the prior art rotor-stator configuration shown in FIG. 3 and a rotor-stator configuration according to a third embodiment of the invention;

FIG. 5a is a cross sectional view of the prior art rotor-stator configuration according to FIG. 5 with a gap-delimiting region constituted by magnets;

FIG. 5b shows the configuration of FIG. 5a deformed by operational loads;

FIG. 5c shows the configuration of FIG. 5a modified with the anticipated deformations shown in FIG. 5b;

FIG. 5d shows the configuration of FIG. 5c deformed by operational loads;

FIG. 5e shows forces acting on FIG. 5 causing the deformations shown in FIGS. 5b and 5d;

FIG. 6 is a schematic representation of the prior art rotor-stator configuration shown in FIG. 3 and a rotor-stator configuration according to a fourth embodiment of the invention;

FIG. 6a is a cross sectional view of the prior art rotor-stator configuration according to FIG. 6 with a gap-delimiting region constituted by magnets;

FIG. 6b shows the configuration of FIG. 6a deformed by operational loads;

FIG. 6c shows the configuration of FIG. 6a modified with the anticipated deformations shown in FIG. 6b;

FIG. 6d shows the configuration of FIG. 6c deformed by operational loads;

FIG. 6e shows forces acting on FIG. 6 causing the deformations shown in FIG. 6b;

FIG. 6f shows forces acting on FIG. 6 causing the deformations shown in FIG. 6d;

FIG. 7 is a schematic representation of another prior art rotor-stator configuration and a rotor-stator configuration according to a fifth embodiment of the invention;

FIG. 7a is a cross sectional view of the prior art rotor-stator configuration according to FIG. 7 with a gap-delimiting region constituted by magnets fixed to the rotor;

FIG. 7b shows the configuration of FIG. 7a deformed by operational loads;

FIG. 7c shows the configuration of FIG. 7a modified with the anticipated deformations shown in FIG. 7b;

FIG. 7d shows the configuration of FIG. 7c deformed by operational loads;

FIG. 7e shows forces acting on FIG. 7 causing the deformations shown in FIGS. 7b and 7d;

FIG. 8 is a schematic representation of some structural aspects of a first embodiment of the air gap optimizing method;

FIG. 8a is a 3D view of the virtual rotor;

FIG. 8b is a cross sectional view, according to the rotational axis, of the virtual rotor in the absence of operational loads;

FIG. 8c is a cross sectional view, according to the rotational axis, of the virtual rotor under operational loads;

FIG. 8d is a 3D representation of the corrected virtual rotor in the absence of operational loads;

FIG. 8e is a cross sectional view, according to the rotational axis, of the corrected virtual rotor in the absence of operational loads;

FIG. 8f is a cross sectional view, according to the rotational axis, of the corrected virtual rotor in the presence of operational loads;

FIG. 9 is a schematic representation of some other quantitative aspects of said first embodiment of the air gap optimizing method;

FIG. 9a is a graph showing the variation of the air gap width with respect to the intentionally distorted rotor and the original rotor;

FIG. 9b is a graph showing the variation of the air gap width with respect to the intentionally distorted rotor and the not intentionally distorted rotor.

FIG. 10 is a schematic representation of some discretization aspects of a second embodiment of the air gap optimizing method;

FIG. 10a is a cross sectional view of the motor-stator configuration of the second embodiment of the air gap optimizing method according to FIG. 10 deformed under operational load;

FIG. 10b shows a target virtual air gap of FIG. 10;

FIG. 10c shows the virtual air gap of FIG. 10a divided into sections of the same width;

FIG. 10d is a single virtual selection of the sections of FIG. 10c; and

FIG. 10e shows a straight line between each pair of midpoints for the sections of FIG. 10c.

DETAILED DESCRIPTION OF EMBODIMENTS OF THE INVENTION

In the following descriptions, numerous specific details are set forth in order to provide a thorough understanding of the present invention. It will be understood by one skilled in the art, however, that the present invention may be practiced without some or all of these specific details. In other instances, well known elements have not been described in detail in order not to unnecessarily obscure the description of the present invention.

Figure 1:
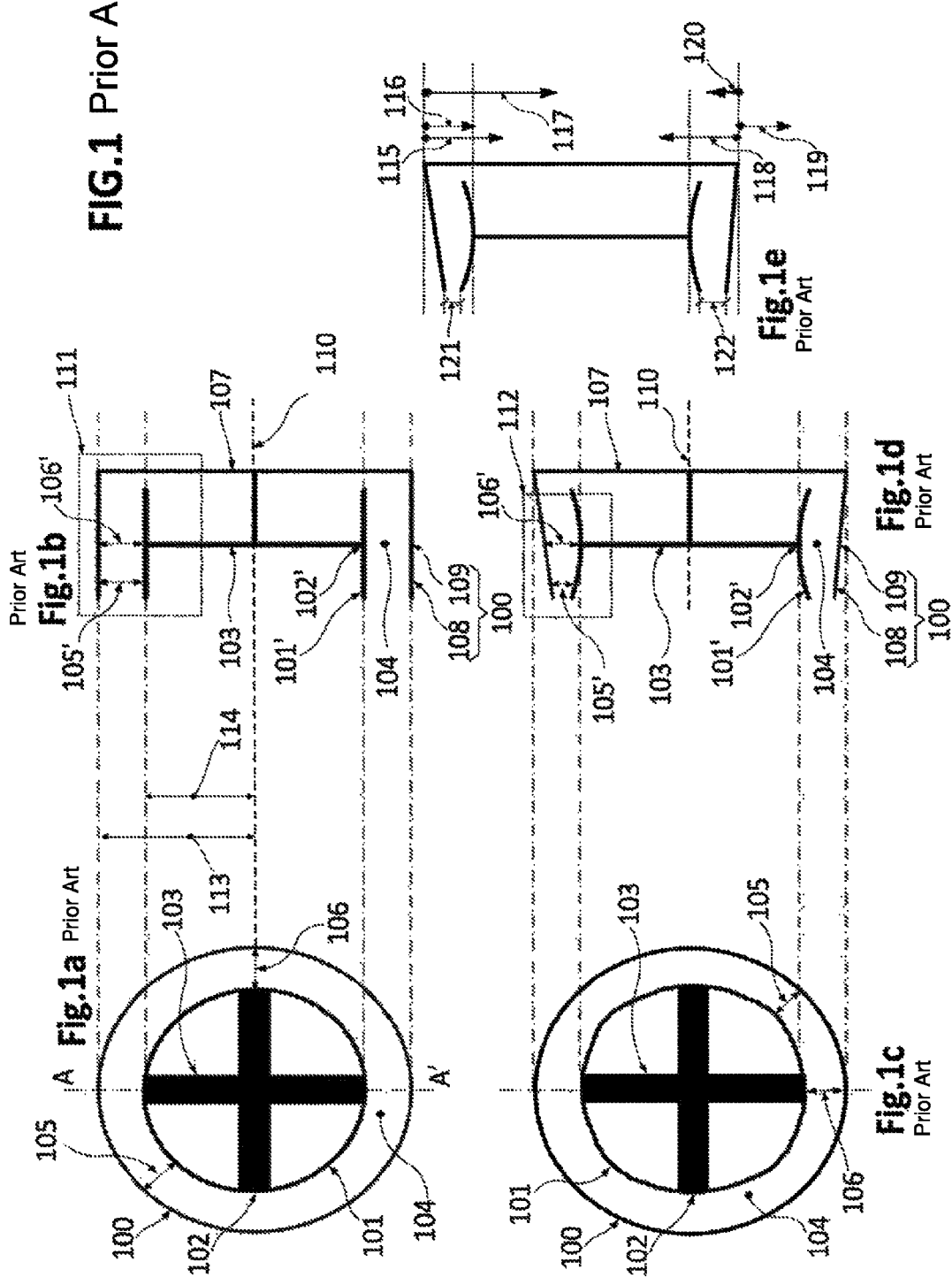
FIG. 1 is a schematic representation of a prior art rotor-stator configuration illustrating degradation of the air gap between the rotor and the stator.

FIG. 1 schematically represents a prior art rotor-stator configuration in the default situation (absence of operational loads) and in the load situation (presence of operational loads), said load situation producing some deformations on the rotor/stator. The main goal of this FIG. 1 is to provide a good understanding of the problem that is solved using various embodiments of the present invention.

FIGS. 1a, 1b, 1c and 1d show an inner structure 101,102, 103/101',102',103 and an outer structure 100. The most common rotor-stator configurations are those in which the inner structure 101,102,103/101',102',103 is the rotor (i.e. configured to rotate with respect to a rotational axis 110) and the outer structure 100 is the stator (i.e. configured to remain stationary). However, it has to be taken into account that rotor-stator configurations in which the inner structure 101, 102,103/101',102',103 is the stator and the outer structure 100 is the rotor are also possible.

For reasons of simplicity, in the following descriptions of embodiments, the inner structure 101,102,103/101',102',103 is always the rotor and the outer structure 100 is always the stator. However, it should be taken into account that in all embodiments the inner structure 101,102,103/101',102',103 may be the stator and the outer structure 100 may be the rotor.

FIG. 1a refers to a frontal view, in the direction of the rotational axis 110, of the rotor-stator configuration in the default situation. FIG. 1b refers to a cross section according to the plane indicated in FIG. 1a through A and A'. FIG. 1c refers to the view of FIG. 1a but reflecting deformations suffered by the rotor/stator in the load situation. And FIG. 1d refers to the view of FIG. 1b but including deformations of the rotor/stator due to operational loads.

The frontal view of FIG. 1a shows an air gap 104 between a gap-delimiting region 100 of the stator and a gap-delimiting region 101,102 of the rotor (the concept of gap-delimiting region in the sense of the present invention is explained in later descriptions with reference to FIG. 2). In FIG. 1a, the rotor comprises various spokes 103 each one of which is joined to a zone 102 of the gap-delimiting region 101,102 of the rotor. The gap-delimiting region 101,102 of the rotor also comprises zones 101 that are not joined to a spoke 103. Zones 102 (joined to a spoke 103) and zones 101 (not joined to a spoke 103) may suffer different levels of deformation due to operational loads, since spokes 103 substantially retain zones 102 when pulled under the influence of operational loads, whereas zones 101 are not retained by any spoke 103. FIG. 1a also shows that the air gap 104 is substantially uniform along the entire circumference (i.e. in the 360°). In this sense, FIG. 1a reflects that the width 106 of the air gap 104 in zones 102 (joined to a spoke 103) is substantially the same as the width 105 of the air gap 104 in zones 101 (not joined to a spoke 103).

FIG. 1b illustrates another view of the air gap 104 between the gap-delimiting region 100 of the stator and the gap-delimiting region 101', 102' of the rotor.

FIG. 1b shows a supporting element 107 which sustains the gap-delimiting region 100 of the stator in such a way that the gap-delimiting region 100 of the stator comprises zones 109 closer to the supporting element 107 and zones 108 more distant from the supporting element 107. Zones 109 are more strongly retained than more distant zones 108, so that deformation on closer zones 109 is smaller than on more distant zones 108. FIG. 1b also reflects that the air gap 104 is substantially uniform along the entire air gap 104 (in this particular view).

FIG. 1c shows the configuration of the FIG. 1a deformed under the effect of operational loads. For reasons of simplicity, no deformation of the gap-delimiting region 100 of the rotor is shown, i.e. it is assumed that the circular shape of the gap-delimiting region 100 of 1a remains unchanged. FIG. 1c shows that the width 105 of the air gap 104 in zones 101 (not retained by a spoke 103) is significantly reduced with respect to the width 105 shown in 1a, whereas the width 106 of the air gap 104 in zones 102 (retained by a spoke 103) is also reduced with respect to the width 106 shown in 1a but not so much as the width 105 in zones 101 (not retained by a spoke 103). In conclusion, the uniform air gap 104 of 1a is converted into the non-uniform (i.e. degraded) air gap 104 of 1c due to the effect of operational loads.

FIG. 1d shows the configuration of the view 1b deformed under the effect of operational loads. FIG. 1d also shows that the width 105' of the air gap 104 in zones 101' (not retained by a spoke 103) is significantly reduced with respect to the width 105' shown in 1b, whereas the width 106' of the air gap 104 in zones 102' (retained by a spoke 103) is also reduced with respect to the width 106' shown in 1b but not so much as the width 105' in zones 101' (not retained by a spoke 103). FIG. 1d further shows how the gap-delimiting region 100 is deformed in a way that more distant zones 108 become closer to the gap-delimiting region 101',102' than less distant zones 109, said deformation of the gap-delimiting region 100 also contributing to the degradation of the air gap 104. Thus, the uniform air gap 104 of 1b is converted into the not uniform (i.e. degraded) air gap 104 of 1d due to the effect of operational loads. Said degradation of the air gap 104 may be produced both in the axial direction (as shown in FIG. 1d) and in the radial direction (as shown in FIG. 1c).

The deformations reflected in FIGS. 1c and 1d may be due to attractive forces caused by electromagnetic forces between the rotor and the stator, and to the weight of the rotor/stator's structures in which the gap-delimiting regions 100 and 101',102' are comprised. Moreover, the torque of the generator in operation may also contribute to deform the rotor-stator configuration.

For example, FIG. 1e shows an example of forces that could cause the deformations reflected in FIGS. 1c and 1d, wherein 115 refers to an attractive force acting on the upper (in this particular view) stator structure, 116 refers to the weight of said upper stator structure, and 117 refers to the resulting force from adding said attractive force 115 and said weight 116. FIG. 1e further shows an attractive force 118 acting on the bottom (in this particular view) stator structure, the weight 119 of said bottom stator structure, and the resulting force 120 from adding the attractive force 118 and the weight 119. Forces deforming the rotor are not shown for reasons of simplicity, but they may be easily devised.

FIG. 1e also shows that both the upper and the bottom stator structure become closer to the rotor, this fact being a consequence of the most influent force in this case is the attractive force 115,118 and not the weight 116,119. FIG. 1e also shows that the smallest width 121 of the air gap in the upper rotor-stator structure is smaller than the smallest width 122 of the air gap in the bottom rotor-stator structure. This difference is a consequence of the resulting force 117 that makes the stator closer to the rotor in the upper structure has a higher value than the resulting force 120 that makes the stator closer to the rotor in the bottom structure.

Figure 2:
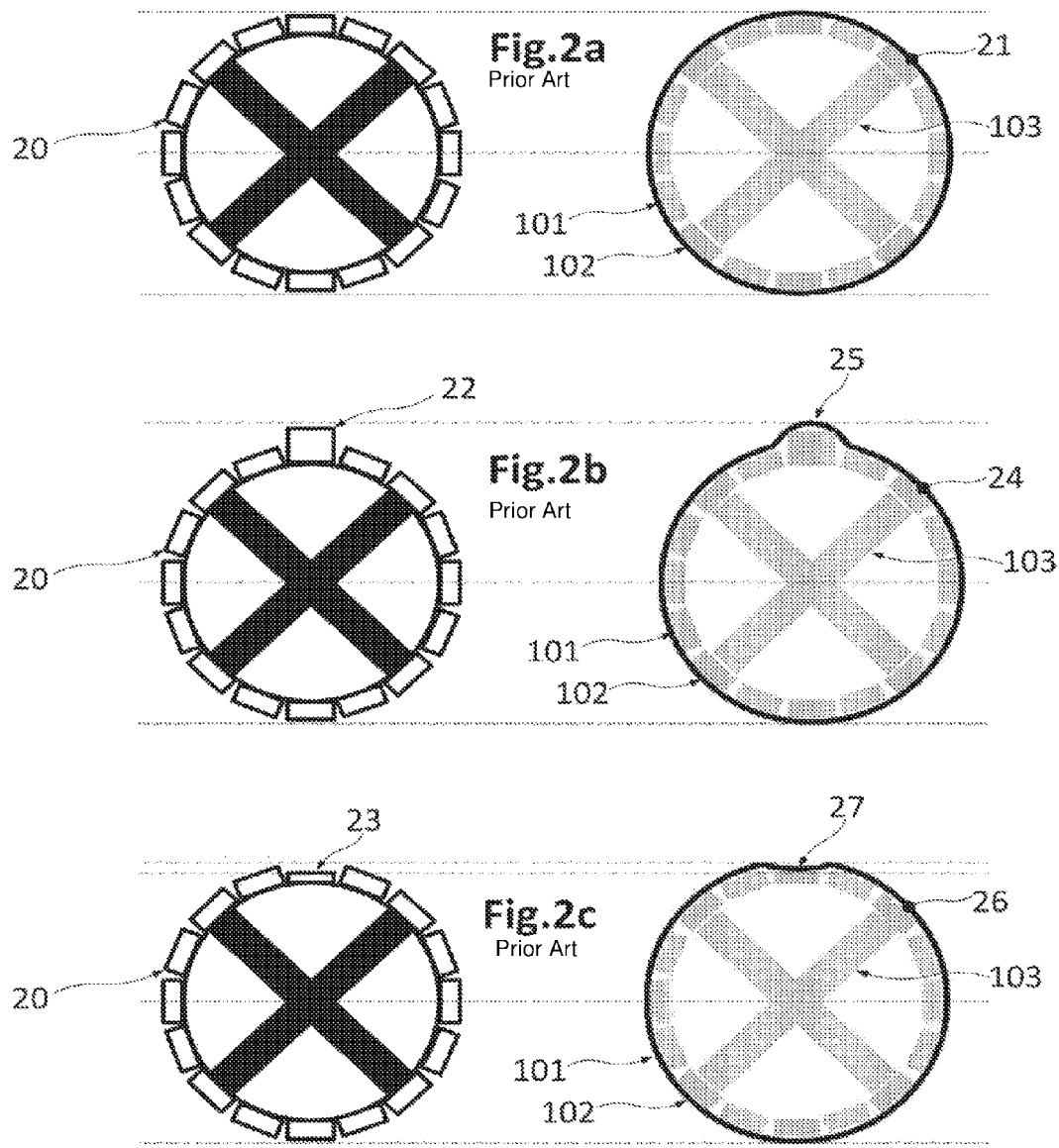
FIG. 2 is a schematic representation of a rotor/stator with permanent magnets illustrating some examples of gap-delimiting regions for a better understanding of embodiments of the invention.

FIG. 2 is a schematic representation of a rotor/stator with permanent magnets illustrating some examples of gap-delimiting regions for a better understanding of later descriptions of embodiments of the invention. In particular, FIG. 2a refers to a view of a typical prior art circular gap-delimiting region 21 in the absence of operational loads, whereas FIGS. 2b and 2c refer to respective views of non-circular gap-delimiting regions 24 and 26 also in the absence of operational loads.

FIGS. 2a and 2b and 2c refer to respective views of a rotor similar to the rotor shown in FIG. 1a, but further comprising permanent magnets 20, plus 22 in 2b and plus 23 in 2c. These three views 2a/2b/2c are shown here to indicate the definition of air gap and gap-delimiting region in the sense of the present invention. In 2a/2b/2c, the rotor comprises some elements (magnets 20/20,22/20,23) that cause a slightly irregular gap-delimiting region (i.e. a non-constant air gap due to e.g. spaces between magnets), but said irregularities may be conceptually smoothed in such a way that a curvilinear gap-delimiting region 21/24/26 may be easily derived.

In particular, all the permanent magnets 20 of 2a substantially have the same size and are uniformly distributed along the 360°, so it may be considered that they constitute a curvilinear gap-delimiting region 21 with circular shape. The view 2b is very similar to the view 2a with the only difference of having a single bigger magnet 22 that causes a curvilinear gap-delimiting region 24 with a local protrusion 25 (caused by said bigger magnet 22). The view 2c is very similar to the view 2a with the only difference of having a single smaller magnet 23 that causes a curvilinear gap-delimiting region 26 with a local depression 27 (caused by said smaller magnet 23).

Still in reference to FIG. 2, the distorting elements causing slight irregular gap-delimiting regions may also comprise windings (e.g. in self-excited generators) or any other overhanging element comprised in the rotor/stator rim. Therefore, all the previously explained principles, in relation to FIG. 2, for easily inferring curvilinear gap-delimiting regions are of identical consideration with independence from the type of elements causing slight irregularities on the rotor/stator rim.

In relation to FIG. 3, FIGS. 3a and 3b show a prior art rotor-stator configuration, and FIGS. 3c and 3d show a rotor-stator configuration according to a first embodiment of the invention. FIG. 3a refers to a section of a rotor-stator configuration very similar to the section 111 of FIG. 1b, with the only difference that the gap-delimiting region 101',102' of the rotor is constituted by permanent magnets 20. The most relevant aspect of 3a is that it represents the substantial uniformity of the air gap 104 in the default situation along the entire air gap 104 (in this particular view). In this respect, 3a reflects that the width 106' of the air gap 104 in zones 109 closer to the supporting element 107 and the width 105' of the air gap 104 in zones 108 more distant from the supporting element 107 are substantially the same.

FIG. 3b shows the configuration of FIG. 3a deformed under the effect of operational loads. For reasons of simplicity, the rotor is assumed as not deformed because e.g. the rotor is highly mechanically reinforced and thus very stiff. FIG. 3b shows how the gap-delimiting region 100 of the stator may be deformed in a way that width 105' of the air gap 104 in more distant zones 108 is significantly reduced in relation to the width 105' of 3a, whereas the width 106' of the air gap 104 in closer zones 109 is also reduced in relation to the width 106' of 3a but not so much as the width 105'. Thus, the combination of FIGS. 3a and 3b reflects how operational loads may transform the uniform air gap 104 of 3a into the degraded air gap 104 of 3b.

FIG. 3c shows an amendment of the configuration 3a according to a first embodiment of the invention, said embodiment comprising the presence of one or more metal sheets 30 between some of the magnets 20 and the surface of the rotor on which said magnets 20 are fixed. The number and/or width of the inserted metal sheets 30 may depend on the anticipated deformations (shown in FIG. 3b) of the rotor and/or stator in such a way that operational loads will transform the non-uniform air gap 104 of 3c into the uniform air gap 104 of 3d. In this particular example, the number and/or width of the inserted metal sheets increases as the proximity of the corresponding magnet 20 to the supporting element 107 of the stator decreases. Particularly, 3c shows that the width 105' of the air gap 104 in more distant zones 108 is not reduced to the same extent (even not at all reduced) as in the closer zones 109, compared with the air gap shown in FIG. 3a.

FIG. 3d shows how intentional distortions (protrusions due to the presence of metal sheets 30) on the rotor/stator in the default situation lead to the uniformity of the air gap 104 of 3d in the presence of operational loads. As shown in FIG. 3d, the width of the final air gap 104 is substantially the same along the entire air gap 104 (in this particular view) in the presence of operational loads. FIG. 3d shows that the width 105' of the air gap 104 in more distant zones 108 and the width 106' of the air gap 104 in closer zones 109 are substantially the same when operational loads are present.

The presence of metal sheets 30 (as shown e.g. in FIGS. 3c and 3d) may cause a local protrusion on the gap-delimiting region 101',102' of the rotor, that may cause at the same time a non-circular and/or non-constant cross-section of the entire (in the 360°) gap-delimiting region 101',102' of the rotor with respect to the rotational axis. In embodiments wherein magnets are fixed on the rotor through supporting bases, local protrusions may be generated by inserting metal sheets between said magnets and their related supporting bases and/or between the supporting bases and the surface of the rotor on which the supporting bases are originally fixed.

The deformations of the stator due to operational loads reflected in FIGS. 3b and 3d may be of the same nature than the deformations of the stator shown in FIGS. 1d and 1e. In this respect, FIG. 3e shows an attractive force 315 acting on the upper (in this particular view) stator structure, the weight 316 of said upper stator structure, and the resulting force 317 from adding the attractive force 315 and the weight 316. FIG. 3e further shows an attractive force 318 acting on the bottom (in this particular view) stator structure, the weight 319 of said bottom stator structure, and the resulting force 320 from adding the attractive force 318 and the weight 319. Both the resulting force 317 in the upper structure and the resulting force 320 in the bottom structure makes the gap-delimiting region 100 of the stator closer to the gap-delimiting region 101',102' of the rotor, as illustrated in FIG. 3e.

FIG. 4 is a schematic representation of the prior art rotor-stator configuration shown in FIG. 3 (FIGS. 4a and 4b are identical to FIGS. 3a and 3b respectively) and a particular rotor-stator configuration according to a second embodiment of the invention. FIG. 4c shows said particular rotor-stator configuration in accordance with the anticipated deformations (shown in FIG. 4b) of the prior art rotor-stator configuration 4a due to operational loads. Particularly, 4c shows how the stator is intentionally pre-deformed with the objective of obtaining the uniform air gap 104 of 4d when operational loads are present.

Said pre-deformation of the stator has the goal of moving the gap-delimiting region 100 of the stator away from the gap-delimiting region 101',102' of the rotor, in such a way that the width of the air gap 104 increases as the distance from the supporting element 107 of the stator increases. In this respect, 4c explicitly shows that the width 105' of the air gap 104 in more distant zones 108 is more highly increased with respect to the width 105' of 4a, whereas the width 106' of the air gap 104 in closer zones 109 is more slightly increased with respect to the width 106' of 4a.

Thus, it may be derived from 4d that the rotor-stator configuration 4c represents an option for taking advantage of the deformations caused by operational loads, for finally obtaining the uniform air gap 104 of 4d. That is to say, intentional pre-deformation of the stator in the default situation lead to the uniformity of the air gap 104 of 4d in the load situation. As shown in FIG. 4d, the width of the final air gap 104 is substantially the same along the entire air gap 104 (in this particular view) when operational loads are present.

The deformations due to operational loads reflected in FIGS. 4b and 4d may be the same as the deformations depicted in FIGS. 3b and 3d. The origin of said deformations is illustrated in FIG. 4e (identical to FIG. 3e) and has been explained in reference to FIG. 3e. Pre-deformation of the stator (as shown in FIGS. 4c and 4f) may cause a non-constant and/or non-circular cross-section of the gap-delimiting region 100 of the stator with respect to the rotational axis, which, in this particular case, coincides with the axis of symmetry of the stator because the rotor-stator configuration of FIG. 4 is a coaxial configuration.

An alternative to the pre-deformation of the stator (as shown in 4c and 4f) could be to pre-deform the rotor in accordance with the anticipated deformations due to operational loads (shown in FIG. 4b). Another alternative could be a combination of both pre-deformation of the stator and pre-deformation of the rotor. Any of said alternatives potentially also allows obtaining a uniform air gap similar to the air gap 104 of FIG. 4d.

FIG. 5 is a schematic representation of the prior art rotor-stator configuration shown in FIG. 3 (FIGS. 5a and 5b are identical to FIGS. 3a and 3b respectively) and a particular rotor-stator configuration according to a third embodiment of the invention. FIG. 5c shows said particular rotor-stator configuration in accordance with the anticipated deformations (shown in 5b) of the prior art rotor-stator configuration 5a due to operational loads. Particularly, 5c shows how the surface of the rotor on which the magnets 20 are fixed is selectively machined 50,51 with the objective of obtaining the uniform air gap 104 of 5d when operational loads are present.

Said selective machining 50,51 of 5c has the goal of moving the gap-delimiting region 101',102' of the rotor away from the gap-delimiting region 100 of the stator, in such a way that the width of the air gap 104 increases as the distance from the supporting element 107 of the stator increases. For example, 5c shows that the width 105' of the air gap 104 in more distant zones 108 is highly increased with respect to the width 105' of 5a, whereas the width 106' of the air gap 104 in closer zones 109 is slightly increased (even not increased) with respect to the width 106' of 5a.

As derived from FIG. 5d, the rotor-stator configuration 5c represents an option for taking advantage of the deformations caused by operational loads for finally obtaining the uniform air gap 104 of 5d in the load situation. That is to say, intentional distortions (consequence of selective machining 50,51) on the rotor/stator in the default situation lead to the uniformity of the air gap 104 of 5d in the presence of operational loads. As shown in 5d, the width of the final air gap 104 is substantially the same along the entire air gap 104 (in this particular view) in the presence of operational loads.

The deformations due to operational loads reflected in FIGS. 5b and 5d may be the same as the deformations depicted in FIGS. 3b and 3d. The origin of said deformations is illustrated in FIG. 5e (identical to FIG. 3e) and has been explained in reference to FIG. 3e.

Selective machining 50,51 of the surface of the rotor on which the magnets 20 are fixed (as shown e.g. in FIGS. 5c and 5d) may cause a local depression on the gap-delimiting region 101',102' of the rotor, that may cause at the same time a non-circular and/or non-constant cross-section of the entire (in the) 360° gap-delimiting region 101',102' of the rotor with respect to the rotational axis.

An alternative to the selective machining 50,51 of the surface of the rotor on which the magnets 20 are fixed (as shown in 5c and 5d), for causing local depressions, could be a selective machining of the magnets 20 in accordance with the anticipated deformations due to operational loads (shown in FIG. 5b). In the case of magnets 20 being originally fixed on the rotor through supporting bases, another alternative could be a selective machining of the supporting bases. Another alternative could be any possible combination of the previously mentioned options: selective machining 50,51 of the surface of the rotor on which the magnets 20 are fixed, selective machining of the magnets, and selective machining of the supporting bases.

FIG. 6 is a schematic representation of the prior art rotor-stator configuration shown in FIG. 3 (FIGS. 6a and 6b are identical to FIGS. 3a and 3b respectively) and a particular rotor-stator configuration according to a fourth embodiment of the invention. In this case, 6a and 6b additionally show the rotational axis 60 of the rotor and the axis of symmetry 61 of the stator, said two axes 60,61 being the same axis because the rotor-stator configuration of 6a and 6b is a coaxial configuration. FIG. 6c shows the particular rotor-stator configuration in accordance with the anticipated deformations (shown in 6b) of the prior art rotor-stator configuration 6a due to operational loads. Particularly, 6c shows how the rotational axis 60 is inclined with respect to the axis of symmetry 61 of the stator with the objective of obtaining the uniform air gap 104 of 6d when operational loads are present.

The inclination of the rotational axis 60 with respect to the axis of symmetry 61 of the stator has the goal of moving the gap-delimiting region 101',102' of the rotor away from the gap-delimiting region 100 of the stator, in such a way that the width of the air gap 104 increases as the distance from the supporting element 107 of the stator increases. For example, 6c shows that the width 105' of the air gap 104 in more distant zones 108 is highly increased with respect to the width 105' of 6a, whereas the width 106' of the air gap 104 in closer zones 109 is more slightly increased or even reduced with respect to the width 106' of 6a.

It may be inferred from 6d that the rotor-stator configuration of 6c represents an option for taking advantage of the deformations caused by operational loads for finally obtaining the uniform air gap 104 of 6d in the load situation. That is to say, intentional distortions (caused by the inclination of the rotational axis 60 with respect to the axis of symmetry 61 of the stator) in the default situation lead to the uniformity of the air gap 104 of 6d in the presence of operational loads. As shown in 6d, the width of the final air gap 104 is substantially the same along the entire air gap 104 (in this particular view) in the presence of operational loads.

The deformations of the stator due to operational loads reflected in FIGS. 6b and 6d may be mainly due to the weight of the parts of the stator that comprise the gap-delimiting region 100 of the stator. FIG. 6e shows an attractive force 615 acting on the upper (in this particular view) stator structure, the weight 616 of said upper stator structure, and the resulting force 617 from adding the attractive force 615 and the weight 616. FIG. 6e further shows an attractive force 618 acting on the bottom (in this particular view) stator structure, the weight 619 of said bottom stator structure, and the resulting force 620 from adding the attractive force 618 and the weight 619.

FIG. 6e also shows that the upper stator structure becomes closer to the rotor but the bottom stator structure becomes more distant from the rotor, this fact being a consequence of the most influent forces in this case are the weights 616,619 and not the attractive forces 615,618. FIG. 6f shows that inclination of the rotational axis 60 with respect to the axis of symmetry 61 of the stator causes a more uniform air gap in both the upper and bottom rotor-stator structures.

The inclination of the rotational axis 60 with respect to the axis of symmetry 61 of the stator is a way of causing misalignment between said two axis 60,61. Another option for obtaining misalignment between the axis 60 and 61 could be displacement of rotational axis 60 of the rotor with respect to the axis of symmetry 61 of the stator. And another option could be a combination of both inclination and displacement of one of the axis 60,61 with respect to the other axis 60,61.

Misalignment of the rotational axis 60 of the rotor with respect to the axis of symmetry 61 of the stator may produce a non-constant cross-section of the gap-delimiting region 101',102' of the rotor and/or a non-coaxial rotor-stator configuration, which may cause a substantially uniform air gap 104 (as shown in FIG. 6d) depending on the anticipated deformations (as shown in FIG. 6b) of the corresponding prior art rotor-stator configuration (as shown in 6a) due to operational loads.

FIG. 7 is a schematic representation of another prior art rotor-stator configuration and a particular rotor-stator configuration according to a fifth embodiment of the invention. FIGS. 7a and 7b refers to a rotor-stator configuration very similar to the configuration of FIGS. 3a and 3b, with the only difference of that each permanent magnet 20 is fixed to the rotor through a supporting base 70. FIG. 7c shows the new rotor-stator configuration in accordance with the anticipated deformations (shown in 7b) of the prior art rotor-stator configuration of 7a due to operational loads. Particularly, 7c shows how supporting bases 70 are selectively machined, with the objective of obtaining the uniform air gap 104 of 7d when operational loads are present.

This selective machining of supporting bases may produce an effect very similar to the effect shown in FIG. 5, which illustrates how intentional distortions based on selectively machining the surface of the rotor on which the magnets are fixed allow obtaining a uniform air gap in the load situation. Thus, all the principles and advantages previously described in reference to FIG. 5 may also be applied to this case.

In summary, different embodiments of the wind turbine generator of the invention may be obtained by causing the gap-delimiting region of the stator and/or the gap-delimiting region of the rotor to have, in the absence of operational loads, one or more non-circular cross-sections and/or a non-constant cross-section with respect to the rotational axis of the rotor; and/or by causing the rotor and the stator to make up, in the absence of operational loads, a non-coaxial configuration. Said non-circular cross-sections and/or non-constant cross-section and/or non-coaxial structure causing the air gap resulting from the presence of operational loads to be more uniform than the air gap in the absence of operational loads.

With respect to the air gap optimizing method of the invention, FIG. 8 is a schematic representation of some structural aspects of a first embodiment of the air gap optimizing method. This embodiment of the method is based on the use of the Finite Element Method (FEM), whose practical application is often known as Finite Element Analysis (FEA).

This particular example of the air gap optimizing method, based on a FEM software, comprises virtually simulating operation of the rotor and the stator under some operational load, wherein the rotor and the stator are represented in the FEM tool through a virtual rotor and a virtual stator which constitute a virtual air gap between them. FIG. 8a shows a 3D view of the virtual rotor, whereas the virtual stator (not shown for reasons of simplicity) is assumed to complete a substantially perfect concentric structure with the virtual rotor. FIG. 8b shows a cross section, according to the rotational axis, of the FEM representation of the virtual rotor in the default situation, i.e. in the absence of operational loads.

In this example of the optimizing method, for reasons of simplicity, only a uniformly distributed load of 23.500 kg/m$^2$ (even though different amounts could be considered) is emulated in the FEM tool. In some embodiments, different types of operational loads may be considered, as for example: weight of the rotor and/or the stator; and/or at least one electromagnetic force between the stator and the rotor; and/or torque caused from the rotation of the rotor; etc. In embodiments of the method, these different types of loads may be simultaneously simulated, or, in alternative embodiments, each operational load may be independently simulated and the results of said independent simulations may be finally grouped.

Once the simulation has been executed, the resulting virtual air gap is compared with a predetermined air gap model. Then, in case of the resulting virtual air gap satisfying the air gap model in terms of having a width between a minimum width and a maximum width along the entire air gap, an ending condition is forced to be satisfied in order to avoid further simulations. Otherwise, in case of the resulting virtual air gap not satisfying the air gap model, some adjustments are calculated and applied to the virtual rotor/stator with the goal of the adjusted virtual rotor/stator to satisfy the air gap model.

Said calculation and application of adjustments comprise calculating a virtual correction of the virtual rotor and/or the virtual stator for adapting the virtual air gap to satisfy the air gap model, and applying said virtual correction to the virtual rotor and/or virtual stator for its consideration in subsequent virtual simulations.

FIG. 8c shows a cross section, according to the rotational axis, of the FEM representation of the virtual rotor resulting from the one or more executed simulations (until satisfaction of the ending condition). The cross section of 8c reflects that zones 101 (not joined to a spoke 103) may be more strongly deformed than zones 102 (joined to a spoke 103), in a manner very similar to the way shown in e.g. FIG. 1c.

Once the loop comprising simulation of operation, and calculation and application of adjustments is ended (by forcing satisfaction of the ending condition), the finally calculated virtual correction (or adjustment) is applied to the rotor and/or the stator.

FIG. 8d illustrates a 3D representation of the corrected virtual rotor, in the absence of operational loads, resulting from the application of the calculated virtual corrections to the virtual rotor once the ending condition has been satisfied. Said FIG. 8d shows intentional distortions 80 introduced on zones 102 (joined to a spoke 103) for compensating the stronger deformation suffered by zones 101 (not joined to a spoke 103). Each of said intentional distortion 80 comprising the aggregation of some metal sheets (two in this particular case) on each zone 102 (joined to a spoke 103).

FIG. 8e shows a cross section, according to the rotational axis, of the FEM representation of the virtual rotor, in the absence of operational loads, resulting from the application of the calculated virtual corrections to the virtual rotor once the ending condition has been satisfied. In particular, FIG. 8e shows aggregation of metal sheets 80 on zones 102 (joined to a spoke 103) but not on zones 101 (not joined to a spoke).

FIG. 8f shows a cross section, according to the rotational axis, of the FEM representation of the virtual rotor, in the presence of operational loads, resulting from the application of the calculated virtual corrections to the virtual rotor once the ending condition has been satisfied. In particular, FIG. 8f shows aggregation of metal sheets 80 on zones 102 (joined to a spoke 103) but not on zones 101 (not joined to a spoke).

Taking into account both the FIG. 8e and the FIG. 8f allows concluding that the applied intentional distortions/protrusions 80 produce a cross section 8f in the load situation that is closer to a circular contour than the cross section 8e in the default situation. That is to say, intentional distortions/protrusions 80 produce an air gap in the load situation that is more uniform than the air gap in the default situation.

Besides, consideration of both FIG. 8c and FIG. 8f allows further concluding that the applied intentional distortions/protrusions 80 produce a cross section 8f (in the load situation) that is closer to a circular contour than the cross section 8c (also in the load situation) without such intentional distortions/protrusions 80. In other words, taking into account that the stator completes a concentric structure with the rotor, it may be concluded that intentional distortions/protrusions 80 cause an air gap (in the load situation) that is more uniform than the air gap (also in the load situation) when no intentional distortions/protrusions 80 are present on the rotor.

All the structural principles about intentional misshapenness commented with respect to the figures referring to embodiments of the wind turbine generator of the invention, may also be applied to the embodiments of the method of the invention. For example: non-circular cross-sections may be due to local protrusions/depressions, etc.

FIG. 9 is a schematic representation of some quantitative aspects of the embodiment for which some main structural aspects are shown in FIG. 8. FIG. 9a refers to a graphic that reflects the distance in the radial direction along the 360° 900 between the intentionally distorted rotor (as shown in FIG. 8f) and the stator in the load situation, and the distance in the radial direction along 360° 901 between the original (not intentionally distorted) rotor (as shown in FIG. 8c) and the stator in the load situation. Said graphic 9a clearly reflects that the variation of the air gap width along the 360° is significantly softer in the intentionally distorted rotor 900 configuration with respect to the original (not intentionally distorted) rotor 901 configuration when operational loads are present.

FIG. 9b offers another view of the air gap width along the 360°, wherein 902 refers to the width related to the intentionally distorted rotor 900 configuration and 903 refers to the width related to the not intentionally distorted rotor 901 configuration. FIG. 9b further offers a graphical view 904 of the intentional distortions/protrusions 80 of FIG. 8 along the entire 360°, each of said intentional protrusions 80 corresponding to a peak (or maximum value) in the graphic 904 and to a valley (or minimum value) in the graphic 903.

FIG. 10 is a schematic representation of some discretization aspects of a second embodiment of the air gap optimizing method. In particular, this figure illustrates how a view of a virtual rotor-stator configuration (and its related virtual air gap 104) may be sectioned for accurately calculating and applying proper virtual corrections to the virtual rotor/stator. FIG. 10a shows a view of the virtual rotor-stator configuration deformed under the effect of operational loads, said view being very similar to the view 112 of FIG. 1d. FIG. 10b shows a target virtual air gap 1001 in accordance with a predetermined air gap model, and a target gap-delimiting region 1002 of the rotor that permits obtaining said target virtual air gap 1001. For reasons of simplicity, it is assumed in this embodiment that no correction of the gap-delimiting region 100 is applied to the stator.

FIG. 10c shows an example of how the virtual air gap 104 of the view 10a may be divided into a plurality of virtual air gap sections 1003-1006 in a way that each virtual air gap section 1003-1006 is partially delimited by a sub-region of the gap-delimiting region 1000 of the virtual rotor and a sub-region of the gap-delimiting region 100 of the virtual stator. FIG. 10c also shows the profile 1019 of the gap-delimiting region of the virtual stator in the default situation (i.e. without deformations due to operational loads), and a plurality of reference lines 1031-1033 defining the sections 1003-1006. In this particular example, the reference lines 1031-1033 are orthogonal to the profile 1019 of the not deformed gap-delimiting region of the virtual stator in a way that all the sections 1003-1006 have the same width.

FIG. 10d is focused on a single virtual section 1003 for reasons of simplicity, the virtual air gap of said virtual section 1003 being comprised between a virtual sub-region 1034 of the stator and a virtual sub-region 1035 of the rotor. FIG. 10d illustrates a possible way of calculating a virtual sub-correction 1012 to be applied to the virtual sub-region 1035 of the virtual rotor for obtaining a target virtual sub-region 1036, with the objective of the virtual air gap of the section 1003 to satisfy its related air gap sub-model in accordance with the virtual air gap model 1001.

The virtual air gap model may comprise a minimum width and a maximum width, so that the virtual air gap satisfies the air gap model when the width of the virtual air gap along the entire virtual air gap is between a minimum width and a maximum width as defined in the air gap model. Each virtual air gap sub-model may comprise a minimum width (which e.g. may be equal to the minimum width of its related virtual air gap model plus/minus a certain tolerance), and a maximum width (which e.g. may be equal to the maximum width of its related virtual air gap model plus/minus a certain tolerance), so that the related virtual air gap section satisfies the virtual air gap sub-model when the width of the virtual air gap section along the entire virtual air gap section is between the minimum width and the maximum width of the air gap sub-model.

In this particular implementation, two reference points 1021,1022 are defined for calculating the virtual sub-correction. The reference point 1021 is the intersection point of the reference line 1031 with the target virtual sub-region 1036, whereas the reference point 1022 is the intersection point of the reference line 1032 with the target virtual sub-region 1036.

The distance 1008 between the reference point 1021 and the intersection point of the reference line 1031 with the virtual sub-region 1034 of the stator may be expressed by the following calculation:

$$1008=(1017-1016)-(1018+1015);$$

wherein:
- 1017 corresponds to the distance 113 of FIG. 1, that is to say, the radius of the (circular) gap-delimiting region of the stator in the default situation;
- 1018 corresponds to the distance 114 of FIG. 1, that is to say, the radius of the (circular) gap-delimiting region of the rotor in the default situation;
- 1016 is the deformation of the stator on the reference line 1031 (distance between the intersection point of the reference line 1031 with the virtual sub-region 1034 of the stator and the intersection point of the reference line 1031 with the profile 1019 of the gap-delimiting region of the virtual stator in the default situation); and
- 1015 is the deformation of the rotor on the reference line 1031 (distance between the reference point 1021 and the intersection point of the reference line 1031 with the profile 1020 of the gap-delimiting region of the virtual rotor in the default situation).

The distance 1009 between the intersection point of the reference line 1032 with the virtual sub-region 1034 of the stator and the intersection point of the reference line 1032 with the virtual sub-region 1035 of the rotor may be expressed by the following calculation:

$$1009=(1017-1014)-(1018+1013);$$

wherein:
- 1014 is the deformation of the stator on the reference line 1032 (distance between the intersection point of the reference line 1032 with the virtual sub-region 1034 of the stator and the intersection point of the reference line 1032 with the profile 1019 of the gap-delimiting region of the virtual stator in the default situation); and
- 1013 is the deformation of the rotor on the reference line 1032 (distance between the intersection point of the reference line 1032 with the virtual sub-region 1035 of the rotor and the intersection point of the reference line 1032 with the profile 1020 of the gap-delimiting region of the virtual rotor in the default situation).

The distance 1010 between the intersection point of the reference line 1032 with the virtual sub-region 1034 of the stator and the reference point 1022 may be expressed by the following calculation:

$$1010=1009-1012;$$

wherein:
- 1009=(1017−1014)−(1018+1013) as explained before; and
- 1012 is the virtual sub-correction to be calculated in relation to the reference point 1022.

As the distance 1010 is known from the predetermined air gap model and the distance 1009 is obtainable from the calculation (1017−1014)−(1018+1013), the virtual sub-correction 1012 related to the reference point 1022 may be obtained from the following calculation:

$$1022\_sub\_correction=(1017-1014)-(1018+1013)-1010.$$

Equivalently, the virtual sub-correction related to the reference point 1021 may be obtained from the following calculation:

1021_sub_correction=(1017−1016)−(1018+1015)−
   1010.

The result of averaging the virtual sub-correction related to the reference point 1021 and the virtual sub-correction 1012 related to the reference point 1022 may be assumed as the virtual sub-correction related to the virtual section 1003. That is to say, the virtual sub-correction related to the virtual section 1003 may be obtained from the following calculation:

1003_sub_correction=(1021_sub_correction+
   1022_sub_correction)/2.

All the previously described calculations focused to obtain a virtual sub-correction related to a virtual air gap section, may be applied to each of the defined sections 1003-1006, so that a particular virtual sub-correction may be obtained for each of the sections 1003-1006. For example, FIG. 10e shows the virtual sub-correction 1023 related to the section 1003, and the virtual sub-correction 1024 related to the section 1004. This figure also shows that a midpoint between each pair of sub-corrections related to contiguous sections may be obtained; for example, 1026 is the midpoint between the sub-correction 1023 (of the section 1003) and the sub-correction 1024 (of the section 1004). Once obtained all the midpoints 1025-1027 for all the pairs of continuous sections, a straight line may be assumed between each pair of contiguous midpoints. For example, FIG. 10e shows a straight line 1029 between the midpoints 1025 and 1026, and a straight line 1030 between the midpoints 1026 and 1027.

In the particular case of the straight line 1029, the inclination 1037 of said line 1029 may be obtained from the following calculation:

1037=1028/width_1003;

wherein:
   1028 is the half of the virtual sub-correction 1012 related to the reference point 1022 (1028=1012/2); and
   width_1003 is the width of the virtual section 1003.

The inclination of each straight line 1029-1030 may be calculated by applying the same principles and calculations described in the previous paragraph in reference to the virtual section 1003. All the straight lines constitute in conjunction an overall (probably non-straight) line that should have a profile similar to the profile of the target gap-delimiting region 1002 (of FIG. 1002). The proximity of this overall line to the target gap-delimiting region 1002 will increase as the number of defined section increases and their width decreases. That is to say, the reliability of obtaining the target gap-delimiting region 1002 will be more and more accurate as the number of sections is bigger and the width of said sections is smaller.

All the explained calculations in reference to FIG. 10 may be implemented by using e.g. a FEM tool, as explained in relation to FIGS. 8 and 9, since this kind of tools are very appropriate to carry out said kind of data processing.

Alternatively to virtual simulations based on a virtual rotor/stator and a virtual air gap between them, prototype based simulations founded on a rotor/stator prototype and an air gap prototype between them may be applied to obtain the same or similar results.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. Thus, it is intended that the scope of the present invention herein disclosed should not be limited by the particular disclosed embodiments described before, but should be determined only by a fair reading of the claims that follow.

The invention claimed is:

1. A wind turbine generator, comprising:
   a rotor, a stator and an air gap between a gap-delimiting region of the stator and a gap-delimiting region of the rotor;
   wherein, in the absence of operational loads, the air gap has a varying width between the gap-delimiting regions of the stator and the rotor;
   wherein one or both of the rotor and the stator are deformable under operational loads;
   wherein one or both of the gap-delimiting region of the stator and the gap-delimiting region of the rotor having, in the absence of the operational loads, one or more non-circular cross-sections with respect to a rotational axis of the rotor that results in the air gap having substantially the same width upon deformation of the rotor or the stator under the operational loads;
   wherein the non-circular cross-section is due to at least one local protrusion of the following types of arrangements:
      presence of one or more metal sheets between a magnet fixed on the rotor/stator and a surface of the rotor/stator on which the magnet is fixed;
      presence of one or more metal sheets between a magnet fixed on the rotor/stator through a supporting base and the supporting base; and
      presence of one or more metal sheets between a supporting base through which a magnet is fixed on the rotor/stator and the surface of the rotor/stator on which the magnet is fixed through the supporting base.

2. The wind turbine generator according to claim 1, further comprising structural means designed into one or both of the rotor and the stator for automatically providing a resultant air gap, upon application of operational loads that cause deformation of the rotor or the stator, having substantially the same width between the gap-delimiting regions of the stator and the rotor wherein the structural means comprises one or both of the gap-delimiting region of the stator and the gap-delimiting region of the rotor having, in the absence of the operational loads, a non-constant cross-section with respect to a rotational axis of the rotor.

3. The wind turbine generator according to claim 2, wherein the non-constant cross-section is due to at least one of the following types of distortion:
   local protrusion of the rotor or stator;
   local depression of the rotor or stator;
   pre-deformation of the rotor or stator before the presence of operational loads; or
   inclination of the rotational axis of the rotor with respect to an axis of symmetry of the stator.

4. The wind turbine generator according to claim 2, wherein the structural means comprises the rotor and the stator, in the absence of the operational loads, having a non-coaxial configuration due to at least one of the following types of distortion:
   inclination of a rotational axis of the rotor with respect to an axis of symmetry of the stator; or
   displacement of the rotational axis of the rotor with respect to the axis of symmetry of the stator.

5. A method for optimizing an air gap between a gap-delimiting region of a stator and a gap-delimiting region of a rotor of a wind turbine generator, the rotor and/or the stator being deformable under a set of operational loads and the optimization consisting of a width of the air gap resulting from the presence of the set of operational loads being substantially the same along the entire air gap, unlike a non-uniform width of the air gap in the absence of the set of operational loads; the method comprising:

repeating until an ending condition is satisfied:
simulating operation of the rotor and the stator under the set of operational loads, the simulation being based on a test rotor representing the rotor, a test stator representing the stator and a test air gap between the test rotor and the test stator;
verifying if the test air gap satisfies an air gap model;
in the case of a positive result:
causing satisfaction of the ending condition;
in the case of a negative result:
calculating a test correction of the test rotor and/or the test stator for adapting the test air gap to satisfy the air gap model;
applying the test correction to the test rotor and/or test stator for its consideration in the next simulation;
verifying if one or more test corrections have been produced; and
in the case of a positive result:
applying the test corrections to the rotor and/or the stator.

6. The method according to claim 5, wherein the air gap model comprises a minimum width and a maximum width; and wherein the test air gap satisfies the air gap model when the width of the test air gap along the entire test air gap is between the minimum width and the maximum width.

7. The method according to claim 5, wherein the set of operational loads comprises one of the following types of loads;
weight of the rotor and/or the stator;
at least one electromagnetic force between the stator and the rotor; and
torque caused from the rotation of the rotor.

8. The method according to claim 5, wherein the set of operational loads comprises at least two of the following types of loads;
weight of the rotor and/or the stator;
at least one electromagnetic force between the stator and the rotor; and
torque caused from the rotation of the rotor; and
wherein simulating operation of the rotor and the stator under the set of operational loads comprises simultaneously simulating all of the operational loads of the set of operational loads.

9. The method according to claim 5, wherein the set of operational loads comprises at least two of the following types of loads;
weight of the rotor and/or the stator;
at least one electromagnetic force between the stator and the rotor; and
torque caused from the rotation of the rotor;
and wherein simulating operation of the rotor and the stator under the set of operational loads comprises independently simulating each operational load of the set of operational loads and grouping the results of the independent simulations.

10. The method according to claim 5, wherein the simulation is a virtual simulation, the test rotor is a virtual rotor, the test stator is a virtual stator, the test air gap is a virtual air gap, and the test correction is a virtual correction.

11. The method according to claim 10, wherein verifying if the virtual air gap satisfies an air gap model comprises:
dividing the virtual air gap into a plurality of virtual air gap sections in a way that each virtual air gap section is partially delimited by a sub-region of the virtual rotor and a sub-region of the virtual stator;
verifying, for each virtual air gap section, if the virtual air gap section satisfies an air gap sub-model in accordance with the air gap model;
wherein calculating a virtual correction of the virtual rotor and/or the virtual stator for adapting the virtual air gap to satisfy the air gap model comprises:
for each virtual air gap section not satisfying its related air gap sub-model, calculating a virtual sub-correction of the virtual rotor sub-region and/or the virtual stator sub-region of the virtual air gap section for adapting the virtual air gap section to satisfy its related air gap sub-model;
and wherein verifying if one or more virtual corrections have been produced comprises:
verifying if one or more virtual sub-corrections have been produced;
and wherein applying the virtual corrections to the rotor and/or the stator comprises:
applying the virtual sub-corrections to the rotor and/or the stator.

12. The method according to claim 11, wherein each air gap sub-model comprises a minimum width and a maximum width; and wherein the virtual air gap section satisfies the air gap sub-model when the width of the virtual air gap section along the entire virtual air gap section is between the minimum width and the maximum width.

13. The method according to claim 5, wherein the simulation is a prototype based simulation, the test rotor is a rotor prototype, the test stator is a stator prototype, the test air gap is an air gap prototype, and the test correction is a prototype based correction.

* * * * *